US010243020B1

(12) United States Patent
Clevenger et al.

(10) Patent No.: US 10,243,020 B1
(45) Date of Patent: Mar. 26, 2019

(54) STRUCTURES AND METHODS FOR EMBEDDED MAGNETIC RANDOM ACCESS MEMORY (MRAM) FABRICATION

(71) Applicant: INTERNATIONAL BUSINESS MACHINES CORPORATION, Armonk, NY (US)

(72) Inventors: Lawrence A. Clevenger, Rhinebeck, NY (US); Nicholas A. Lanzillo, Troy, NY (US); Michael Rizzolo, Albany, NY (US); Theodorus E. Standaert, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/799,502

(22) Filed: Oct. 31, 2017

(51) Int. Cl.
| | | |
|---|---|---|
| *H01L 29/82* | (2006.01) | |
| *H01L 27/22* | (2006.01) | |
| *H01L 43/08* | (2006.01) | |
| *G11C 11/16* | (2006.01) | |
| *H01L 43/12* | (2006.01) | |
| *H01L 43/02* | (2006.01) | |

(52) U.S. Cl.
CPC .......... *H01L 27/228* (2013.01); *G11C 11/161* (2013.01); *H01L 43/02* (2013.01); *H01L 43/08* (2013.01); *H01L 43/12* (2013.01)

(58) Field of Classification Search
CPC ......... H01L 43/02; H01L 43/08; H01L 43/12; H01L 27/228
USPC ................................................. 257/421, 422
See application file for complete search history.

(56) References Cited

U.S. PATENT DOCUMENTS

| | | |
|---|---|---|
| 6,783,999 B1 | 8/2004 | Lee |
| 6,784,091 B1 | 8/2004 | Nuetzel et al. |
| 7,381,574 B2 | 6/2008 | Kim et al. |
| 7,635,884 B2 | 12/2009 | Gaidis et al. |
| 7,772,663 B2 | 8/2010 | Kanakasabapathy et al. |
| 8,183,061 B2 | 5/2012 | Zhong et al. |
| 8,289,757 B2 | 10/2012 | Keshtbod et al. |
| 8,674,465 B2 | 3/2014 | Li et al. |
| 8,772,051 B1 | 7/2014 | Zhong et al. |
| 9,373,663 B2 | 6/2016 | Satoh et al. |
| 9,853,087 B2 * | 12/2017 | Suh ........................ H01L 43/12 |
| 2017/0092847 A1 * | 3/2017 | Kim ...................... G11C 11/161 |

* cited by examiner

*Primary Examiner* — Tan N Tran
(74) *Attorney, Agent, or Firm* — Tutunjian & Bitetto, P.C.; Vazken Alexanian

(57) ABSTRACT

A magnetic random access memory (MRAM) device includes a conductor disposed in an insulating material of a lower wiring layer, a magnetic tunnel junction (MTJ) structure formed in an upper wiring layer, and a landing pad formed in an intermediary wiring layer between the lower and upper wiring layers, the landing pad extending from a top surface of the conductor to a height above the intermediary wiring layer, wherein the landing pad connects the MJT structure to the conductor.

13 Claims, 10 Drawing Sheets

STRUCTURES AND METHODS FOR EMBEDDED MAGNETIC RANDOM ACCESS MEMORY (MRAM) FABRICATION

BACKGROUND

Technical Field

The present invention generally relates to magnetic random access memory (MRAM) devices, and more particularly to methods and structures for embedding MRAM devices without impacting prior interconnect structures.

Description of the Related Art

Magnetic random access memory (MRAM) technology is often employed as a non-volatile memory for computing devices. An MRAM often includes a magnetic tunnel junction (MTJ) structure having magnetic (e.g., ferromagnetic) layers separated by an intermediary non-magnetic tunnel barrier layer. Digital information can be stored in the memory element and can be represented by directions of magnetization vectors. In response to voltage applied to the MTJ, the magnetic memory element exhibits different resistance values and allows a MRAM device to provide information stored in the magnetic memory element.

Conventional MRAM devices are fabricated with a field effect transistor (FET) based configuration. In such configuration, each MRAM cell includes a MTJ formed over a conductive metal strap that connects the bottom of the MTJ to an access transistor. A via is formed on top of the MTJ to couple the MTJ to an upper metallization line. However, due to decreasing device and wiring sizes, scaling and embedding MRAM devices become extremely difficult due to current-carrying restrictions on narrow wires used for switching the state of the MRAM cells, shrinking real estate and increasing patterning complexity for both the MTJ device and interconnects.

SUMMARY

In accordance with an embodiment of the present invention, a magnetic random access memory (MRAM) device is provided. The MRAM device includes a conductor disposed in an insulating material of a lower wiring layer, a magnetic tunnel junction (MTJ) structure formed in an upper wiring layer, and a landing pad formed in an intermediary wiring layer between the lower and upper wiring layers, the landing pad extending from a top surface of the conductor to a height above the intermediary wiring layer, wherein the landing pad connects the MJT structure to the conductor.

In accordance with an embodiment of the present invention, a method for forming a MRAM device is provided. The method includes forming a conductor disposed in a lower wiring layer, forming a via in an insulating material of an intermediary wiring layer down to the lower wiring layer in an MRAM region to expose the conductor, depositing a conductive material in the via, planarizing the conductive material to a height above the intermediary wiring layer to form a landing pad extending from a top surface of the conductor to the height, forming a MTJ structure in an upper wiring layer disposed over the landing pad such that the landing pad connects the MJT structure to the conductor, and forming contacts to the MJT structure in the upper wiring layer.

In accordance with an embodiment of the present invention, a method for forming a MRAM device is provided. The method includes forming a conductor disposed in a lower wiring layer, forming a via in an insulating material of an intermediary wiring layer down to the lower wiring layer in an MRAM region to expose the conductor, depositing a conductive material in the via, planarizing the conductive material to a height above the intermediary wiring layer to form a landing pad extending from a top surface of the conductor to the height, the landing pad being formed from a same material such that the landing pad is free of interfaces, forming a MTJ structure in an upper wiring layer disposed over the landing pad such that the landing pad connects the MJT structure to the conductor, forming spacers on sidewalls of the MTJ structure to prevent diffusion, and forming contacts to the MJT structure in the upper wiring layer.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
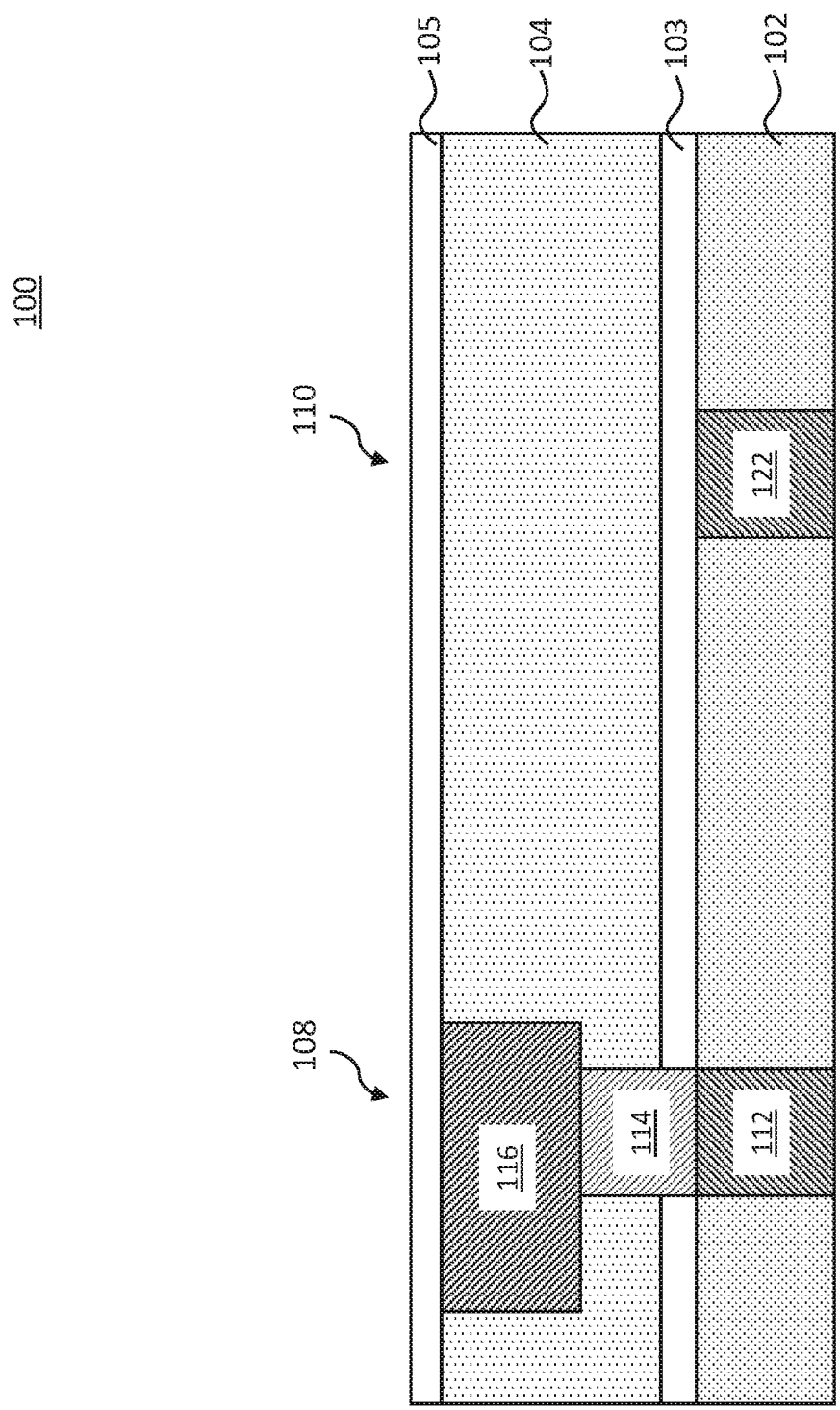
FIG. 1 is a cross-sectional view of a partially fabricated magnetic random access memory (MRAM) device showing a logic structure in a logic region having contacts formed in an intermediary wiring layer to connect to a conductor in a lower wiring layer in accordance with the present principles.

In accordance with embodiments of the present invention, systems and methods are provided for fabricating an embedded MRAM structure. The systems and methods disclosed herein embed the MRAM structure in a manner that eliminates impacting and/or damaging previously formed interconnect structures with respect to conventional devices. A landing pad structure is formed in an interconnect level (e.g., metallization line) and extends multiple interconnect levels to couple a magnetic tunnel junction (MTJ) to underlying conductors in lower wiring layers. The underlying conductors are not exposed during any of the MRAM processing steps, and the methods and structures described herein provide MRAM devices having lower vertical resistance than conventional devices.

The MRAM structure can include multiple interconnect levels and/or metallization lines (e.g., wiring levels). Each of the wiring layers may be separated by one or more etch stop layers. In some embodiments, one or more of the etch stop layers can prevent diffusion between the metallization lines. Methods and structures described herein include a landing pad disposed between metallization lines, and extending, at least partially, through multiple wiring levels to couple an MTJ in an upper wiring level to a conductor in a lower wiring level. In some embodiments, the landing pad is free of any internal interfaces.

Aggressive scaling of the wiring levels may invoke patterning techniques, such as self-aligned double patterning (SADP) or self-aligned quadruple patterning (SAQP). While such techniques enable the desired patterns and density for logic circuitry, they may not be optimal for the memory cell itself. In particularly useful embodiments, the methods and systems described herein allow customized patterning of the landing pads, independent of the wiring within that interconnect layer. The memory cell can contain wiring patterns generated by SADP and landing pads that are formed independently, all within the same interconnect layer.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a cross-sectional view of a partially fabricated FET-based MRAM device 100 in accordance with an embodiment of the present invention is illustrated. The MRAM device 100 includes multiple interconnect levels and/or metallization lines (e.g., wiring levels). For example, the MRAM device 100 includes a lower wiring or contact level 102, an upper wiring level 106 (FIG. 8), and an interlevel dielectric layer 104 disposed between the upper and lower wiring levels 102, 106. The wiring layers may be separated by one or more etch stop layers 103, 105, and the etch stop layers 103, 105 may include an oxide and/or nitride material (e.g., silicon nitride ($Si_3N_4$), titanium nitride (TiN)) or similar functioning materials. In some embodiments, the etch stop layers 103, 105 prevent diffusion between the multiple metallization lines 102, 104, 106.

Each of the wiring levels 102, 104, 106 can include insulating materials, such as dielectric material. For example, each wiring level 102, 104, 106 can include an interlevel dielectric layer. The interlevel dielectric layer may be selected from the group consisting of silicon containing materials, such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H). Additional choices for the interlevel dielectric layer include any of the aforementioned materials in porous form, or in a form that changes during processing to or from being porous and/or permeable to being non-porous and/or non-permeable.

In some embodiments, the MRAM device 100 includes logic wiring region/structure 108 and a MRAM region 110. The logic wiring 108 includes one or more logic vias 114 and metallization lines 116 connected to a logic wiring conductor 112 in the lower wiring level 102. The MRAM region 110 includes a conductor 122 in the lower wiring level 102. It should be noted that logic wiring conductor 112, conductor 122 and/or lower wiring level 102 could be a middle-of-the-line level. For example, logic wiring conductor 112 and conductor 122 can include tungsten contacts that connect to source/drain regions and gate structures. The vias and/or metallization structures (e.g., contacts) may include conductive material, such as, but not limited to, Copper (Cu). Additional liners and/or barrier layers (not shown) may be disposed between the conductive material and the surrounding insulating material. The liners may include, for example, Tantalum (Ta), Titanium (Ti), Tantalum Nitride (TaN), Titanium Nitride (TiN), Cobalt (Co), Ruthenium (Ru) or similarly functioning material.

Conductors 112, 122 are formed in the lower wiring level 102 having an etch stop layer 103 formed thereon. The conductors 112, 122 may be formed by, for example, depositing a dielectric material 102 and optional hardmask layer (not shown), forming a via through the dielectric material 102, and filling the via with conductive material. A planarization process can be employed to planarize the conductive material and/or hardmask layer (if present), and a barrier film/etch stop layer 103 can be formed thereon. In the logic region 108, a second dielectric layer 104 may be formed. Vias and trenches are etched into an intermediary wiring layer 104, such as a dielectric layer, and filled with a conductive material to form a via 114 (e.g., vertical interconnect) and the line 116. A second barrier layer/etch stop layer 105 is deposited over the wiring layer 104.

Figure 2:
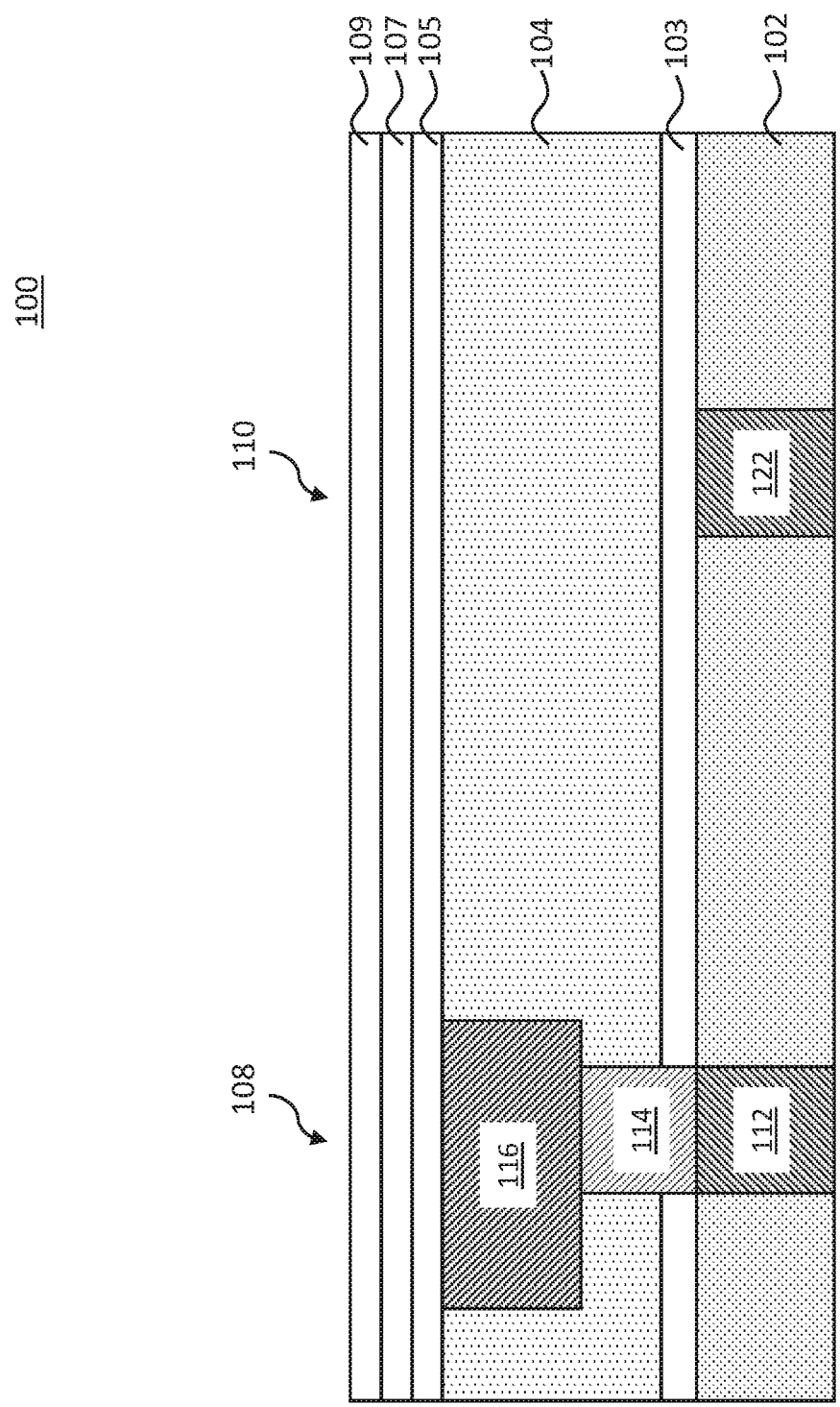
FIG. 2 is a cross-sectional view of the MRAM device of FIG. 2 showing etch stop layer(s) formed over the logic region and an MRAM region adjacent to the logic region in accordance with the present principles.

Referring to FIG. 2, a third etch stop layer 107 and/or hardmask layer 109 can be deposited over the second etch stop layer 105. The third etch stop layer 107 and/or hardmask layer 109 can include, for example, a sacrificial nitride material, such as titanium nitride (TiN), or any other suitable materials. It should be noted that the third etch stop layer 107 and/or hardmask layer 109 may be omitted when the second etch stop layer 105 is present.

Figure 3:
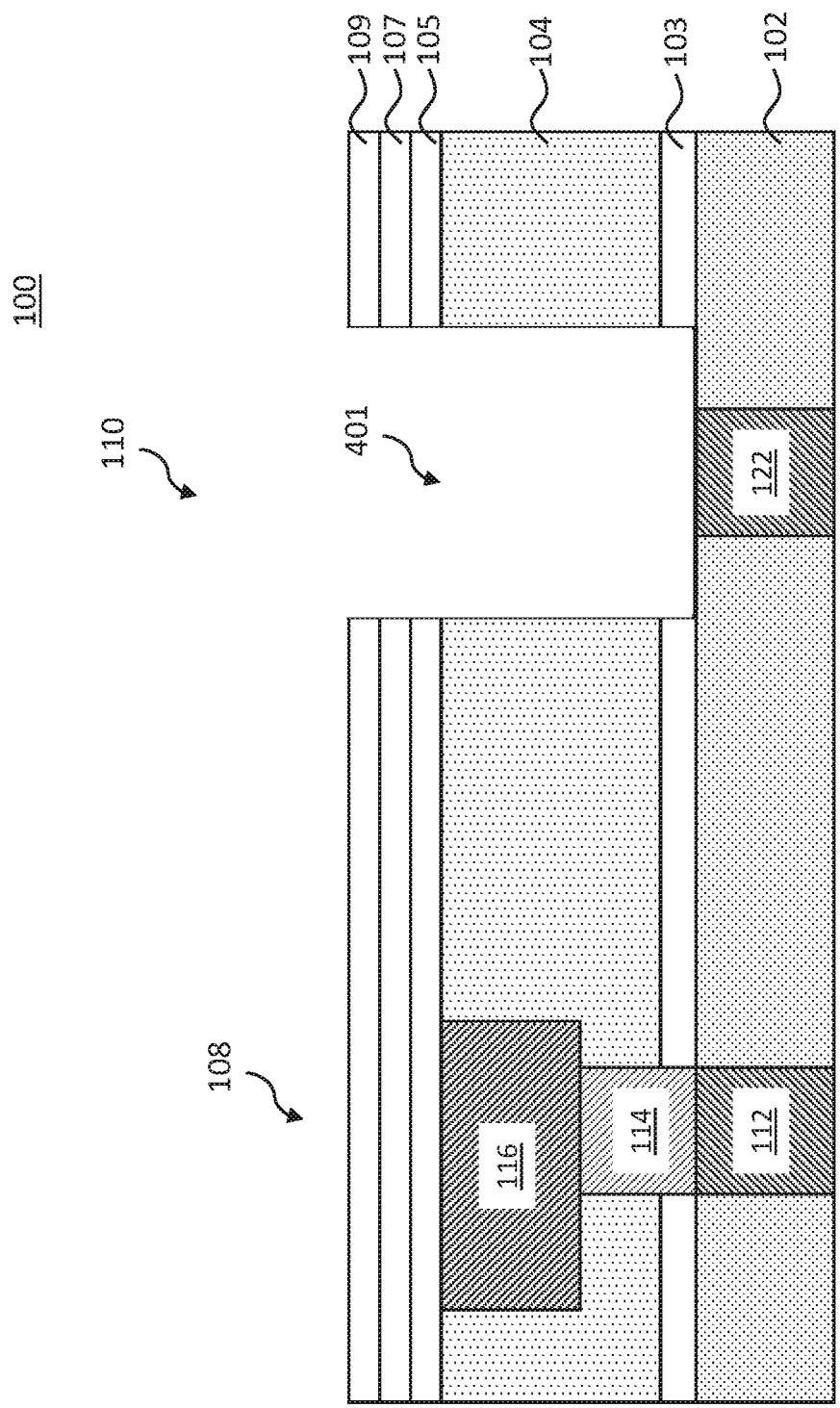
FIG. 3 is a cross-sectional view of the MRAM device of FIG. 3 showing a via formed through the etch stop layer(s) and intermediary wiring layer down to a conductor in the MRAM region in accordance with the present principles.

In FIG. 3, an etching process is performed through layers 105, 107, 109 (if present), wiring layer 104 and/or etch stop layer 103 to form via 401 down to the conductor 122 in the first wiring layer 102 in the MRAM region 110. The via 401 may be formed, for example, by reactive ion etch (RIE) processes or other etch processes known in the art. Because a dedicated island patterning technique is implemented to provide the via 401, flexible island formation is possible even if the via/line 114, 116 in metallization layer 104 is formed using self-aligned double patterning (SADP) or self-aligned quadruple patterning (SADP) processes.

Figure 4:
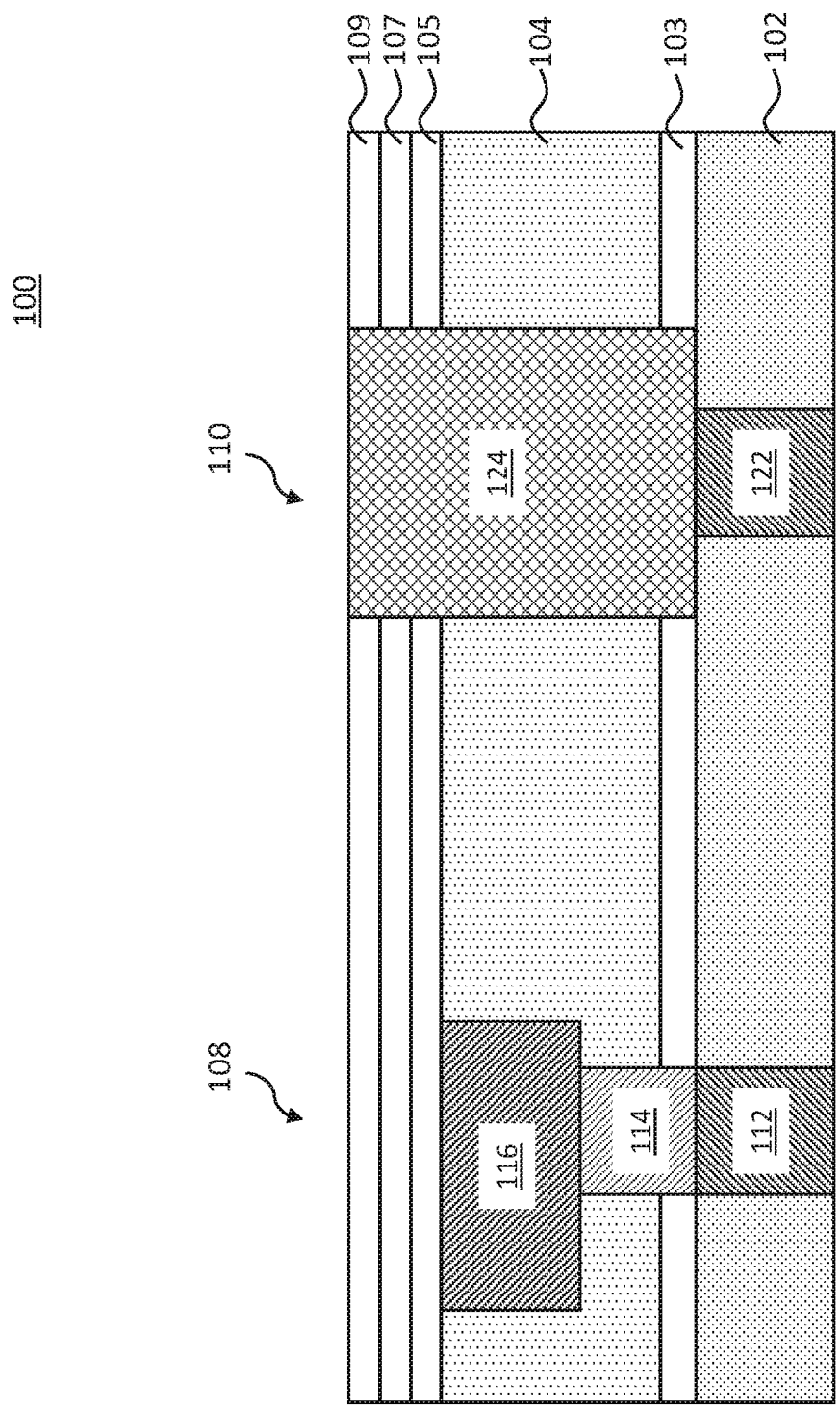
FIG. 4 is a cross-sectional view of the MRAM device of FIG. 4 showing a landing pad extending down to the conductor in the MRAM region in accordance with the present principles.

In FIG. 4, a conductive material 124 is deposited over the MRAM device 100 and in the via 401. A chemical mechanical polishing (CMP) or other planarization process is performed to form a landing pad 124. For example, the CMP process may planarize the conductive material of the landing pad 124 down to a top surface of the hardmask layer 109 (if present). The landing pad 124 can include conductive material, such as tungsten, Cobalt (Co), tantalum nitride (TaN), titanium nitride (TiN), Ruthenium (Ru), Copper (Cu) reflow, or alloys thereof. However, other conductive materials for the land pad 124 are readily contemplated. As illustrated in FIG. 4, the landing pad 124 does not include any interfaces in the intermediary layer 104.

Figure 5:
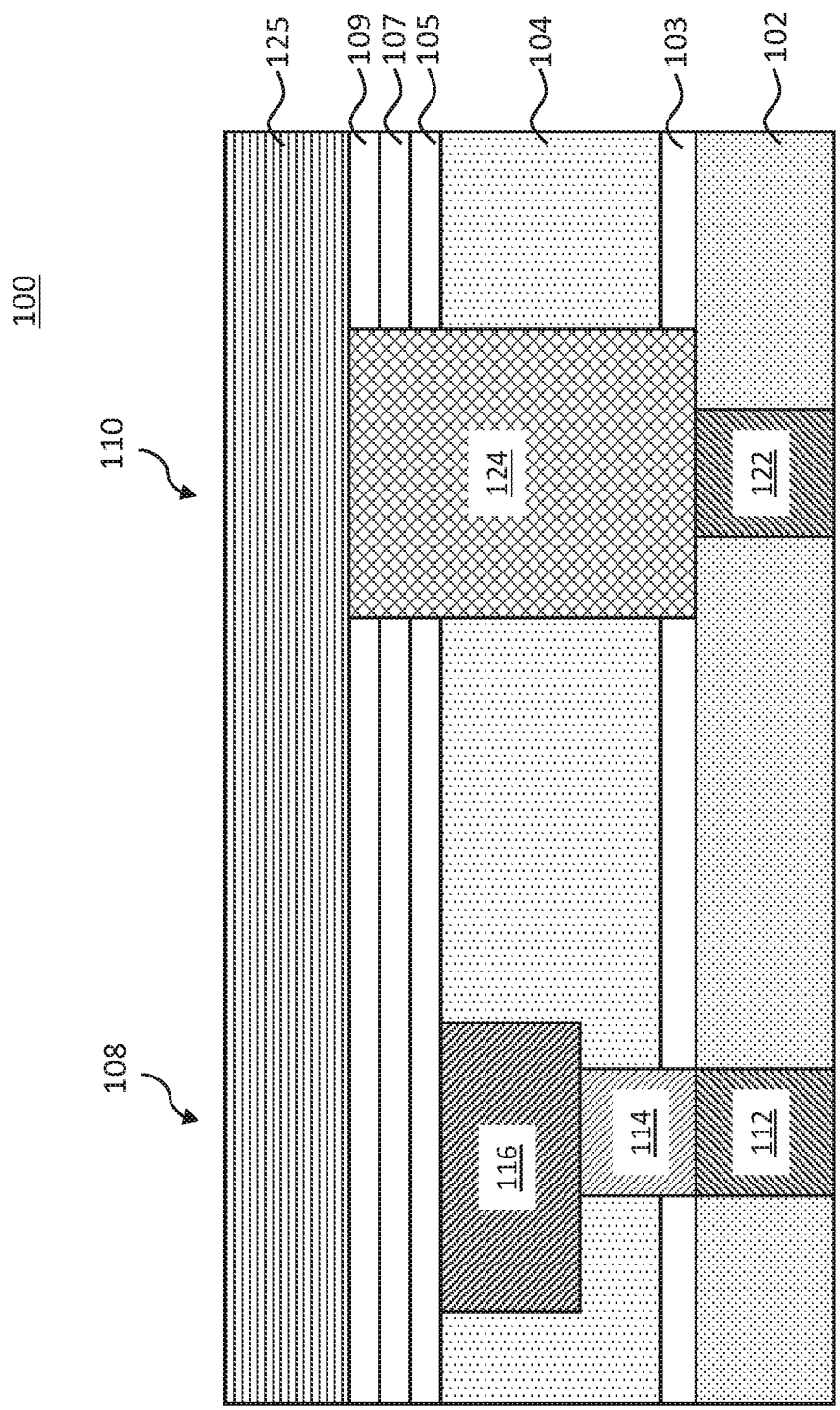
FIG. 5 is a cross-sectional view of the MRAM device of FIG. 5 showing a magnetic tunnel junction (MTJ) layer formed over the MRAM device in accordance with the present principles.

Referring now to FIG. 5, an MTJ layer(s) 125 is/are conformally deposited over the MRAM device 100. It should be noted that while FIG. 5 illustrates the MTJ layer 125 as a single layer, the MTJ layer 125 can include multiple layers to form the MTJ, which can include magnetic (e.g., ferromagnetic) layers separated by an intermediary non-magnetic tunnel barrier layer.

Figure 6:
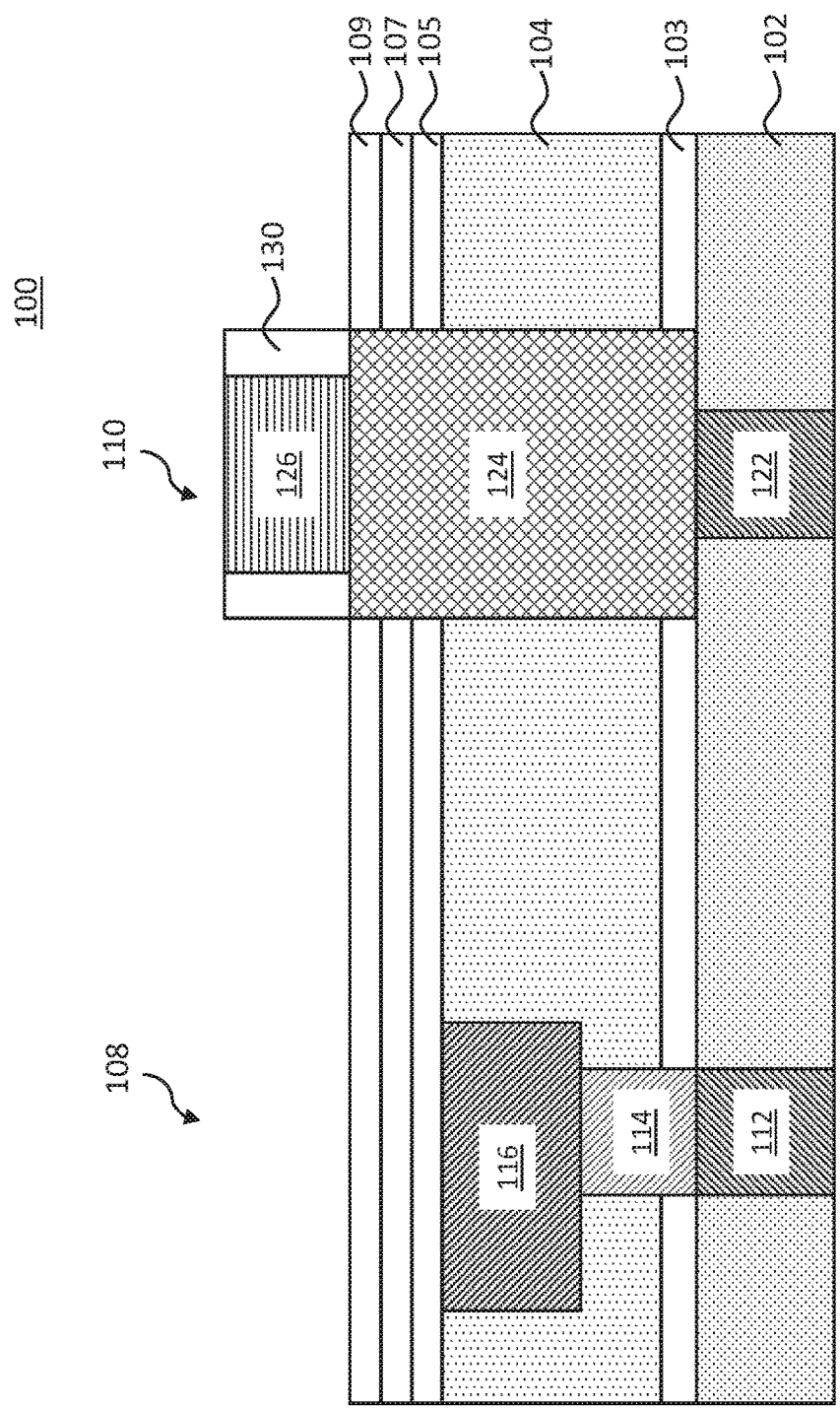
FIG. 6 is a cross-sectional view of the MRAM device of FIG. 6 showing patterning of the MTJ layer to form an MTJ structure in the MRAM region, the MTJ structure having spacers formed on sidewalls of the MTJ structure, in accordance with the present principles.

In FIG. 6, the MTJ layer 125 is patterned to form the MTJ structure 126 using, for example, an ion beam etching (IBE) process. The MTJ structure 126 may be similar in width to the landing pad 124. In some embodiments, the MTJ structure 126 can have a larger width than the landing pad 124 (not shown). In some embodiments, spacers 130 can be formed on sidewalls of the MTJ structure 126. The spacers 130 may comprise a dielectric material, such as a nitride, oxide, oxynitride, or a combination thereof. The spacers 130, which may include nitride (e.g., SiN), encapsulate the MTJ structure 126 to prevent diffusion from adjacent insulating layers into the MTJ stack 126 and protect sensitive layers in the MTJ stack 126 from subsequent processing.

Figure 7:
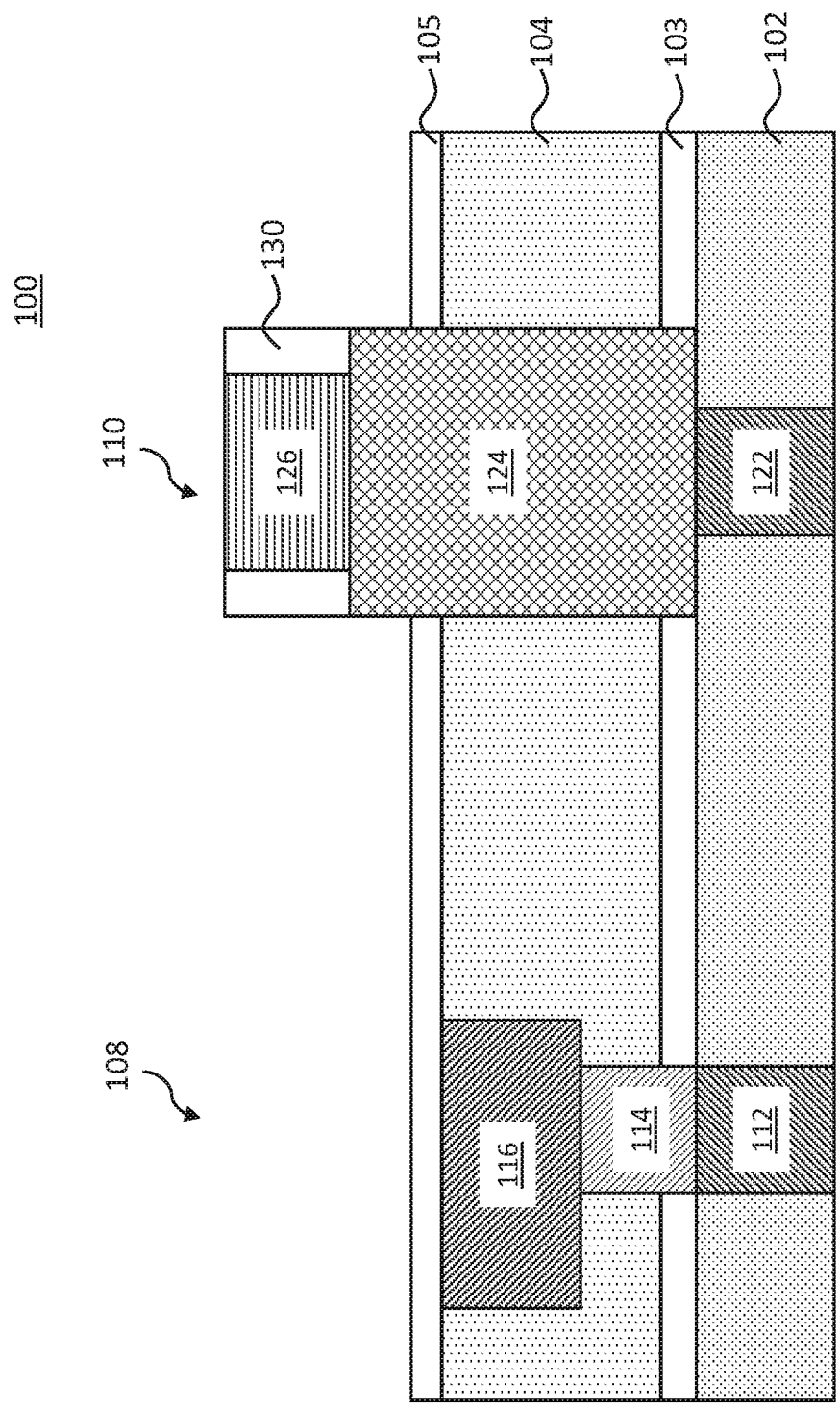
FIG. 7 is a cross-sectional view of the MRAM device of FIG. 7 showing the etch stop layer(s) removed from the MRAM device in accordance with the present principles.
Figure 8:
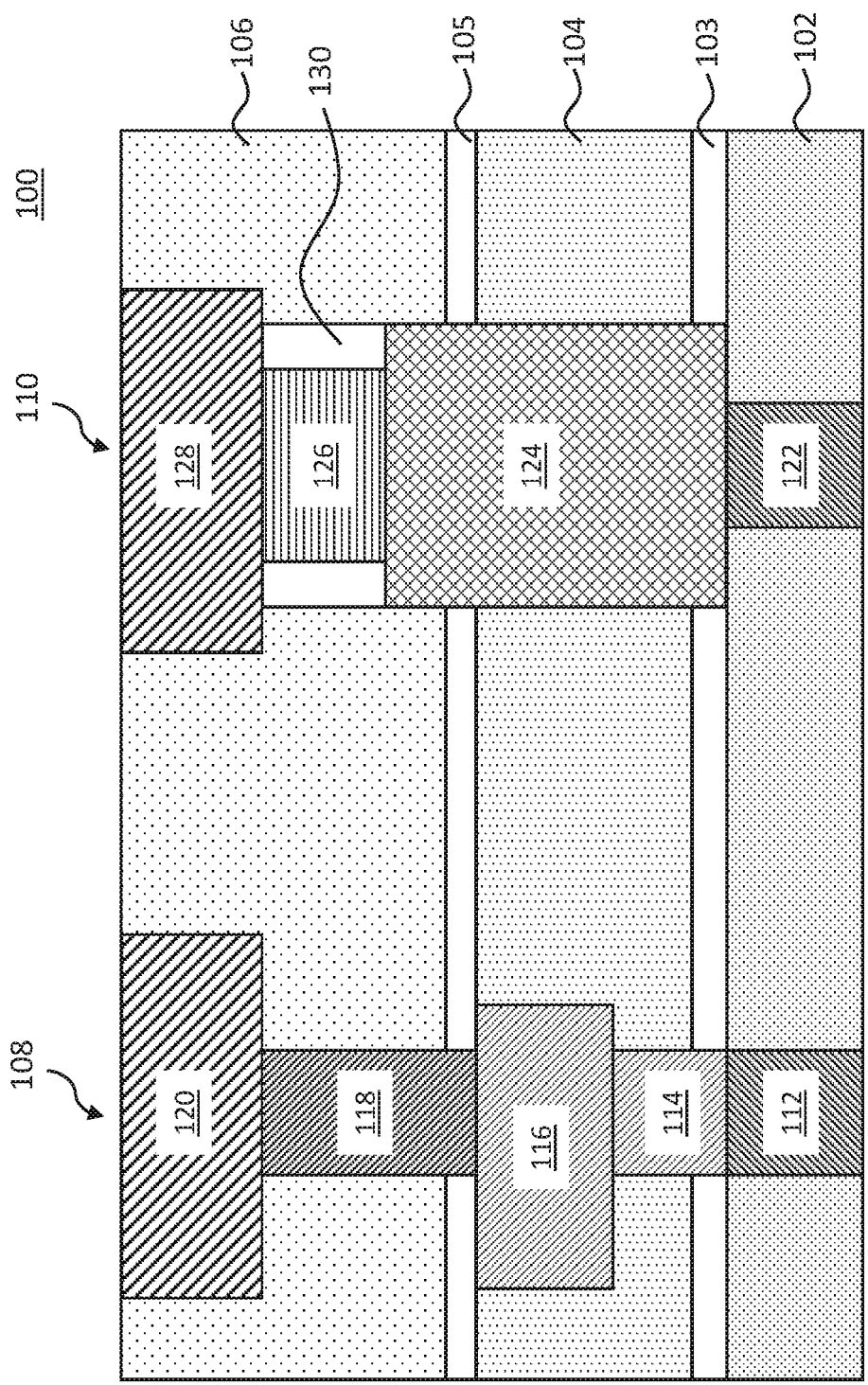
FIG. 8 is a cross-sectional view of the MRAM device of FIG. 8 showing contacts formed concurrently in the logic region and MRAM region in accordance with the present principles.

In FIG. 7, the etch stop and/or hardmask layers 107, 109 can be removed by an etch process, such as reactive ion etch (RIE) or wet etch processes. As shown in FIG. 8, the landing pad 124 extends over the intermediary wiring layer 104 and etch stop layer 105, and connects the MTJ structure 126 to the conductor 122. One or more protection layers (not shown), such as one or more insulating and/or diffusion barrier layers, may be conformally deposited over the MRAM device 100 and along sidewalls of the spacers 130 and/or MTJ structure 126.

Now referring to FIG. 8, an insulating material 106, such as a flowable dielectric, can be deposited over the MRAM device 100 in the logic region 108 and MRAM region 110 to form a third metallization layer 106. The insulating material 106 can be etched in both the logic region 108 and MRAM region 110. For example, contacts 120 and 128, and vias 118 (e.g., vertical interconnects), can be etched concurrently using conventional dual damascene schemes, and filled with a conductive material to form contacts/vertical interconnects between the logic structure 108 and MRAM structure 110 to lower wiring layers 102, 104. Accordingly, contacts 120, 128 can be concurrently formed. The etch process can be optimized such that the depth, etch chemistry and subsequent cleaning processes render a reliable and low resistance contact between the MTJ device 126 and the contact 128. The contacts 120, 128 can include, for example, copper (Cu) or other conductive material. In the MRAM region 110, the upper conductor/contact 128 can be directly coupled to the MTJ 126 and can include a metal material, such as Copper (Cu) or similarly functioning materials.

Conventional landing pads are typically embedded in a top portion of a prior interconnect structure (e.g., metallization structure) in the same wiring level, or placed on top of a prior wiring level, and is indirectly connected to conductors in lower wiring levels through additional vias. Moreover, conventional landing pads are disposed only within a single metallization layer. Accordingly, conventional devices suffer from the presence of additional interfaces, which can increase resistance in the MRAM structure and can damage the prior interconnect structures. In addition, fabrication of such conventional devices often employ interconnect patterning below the landing pad which is not optimal for the desired MRAM cell layout, for example, in the case of SADP (self-aligned double patterning).

As illustrated in FIG. 8, the landing pad 124 extends a plurality of wiring levels 102, 104, 106 (e.g., M0, M1, M2, etc.) coupling the MTJ structure 126 to the conductor 122 in lower wiring levels. In some embodiments, the landing pad 124 couples (e.g., directly connects) an MTJ 126 in the upper wiring level 106 and to a conductor 122 in the lower wiring level 102. For example, an upper surface of the landing pad 124 is in direct contact with a bottom surface of the MTJ 126 in the upper wiring level 106, and the bottom surface of the landing pad 124 is in direct contact with an upper surface of the lower conductor 122 in the lower wiring level 102.

The landing pad 124 can be free of any internal interfaces such that an interface only exists between the MTJ 126 and the lower conductor 122. For example, the landing pad 124 does not include any interfaces in the intermediary layer 104. Accordingly, less interfaces exist within the landing pad structure 124 and, as a result, the MRAM device 100 can exhibit lower vertical resistance versus conventional devices. In addition, the formation of the landing pad 126 does not impact (e.g., damage) prior interconnect structures disposed in the wiring layers, such as those present in the middle of the line (MOL), since the landing pad 124 is not embedded into a prior metallization structure, but rather formed in a separate and dedicated processing step. It should be noted that while three metallization layers are illustratively depicted, additional metallization layers are readily contemplated such that the landing pad extends between more than three metallization layers.

Figure 9:
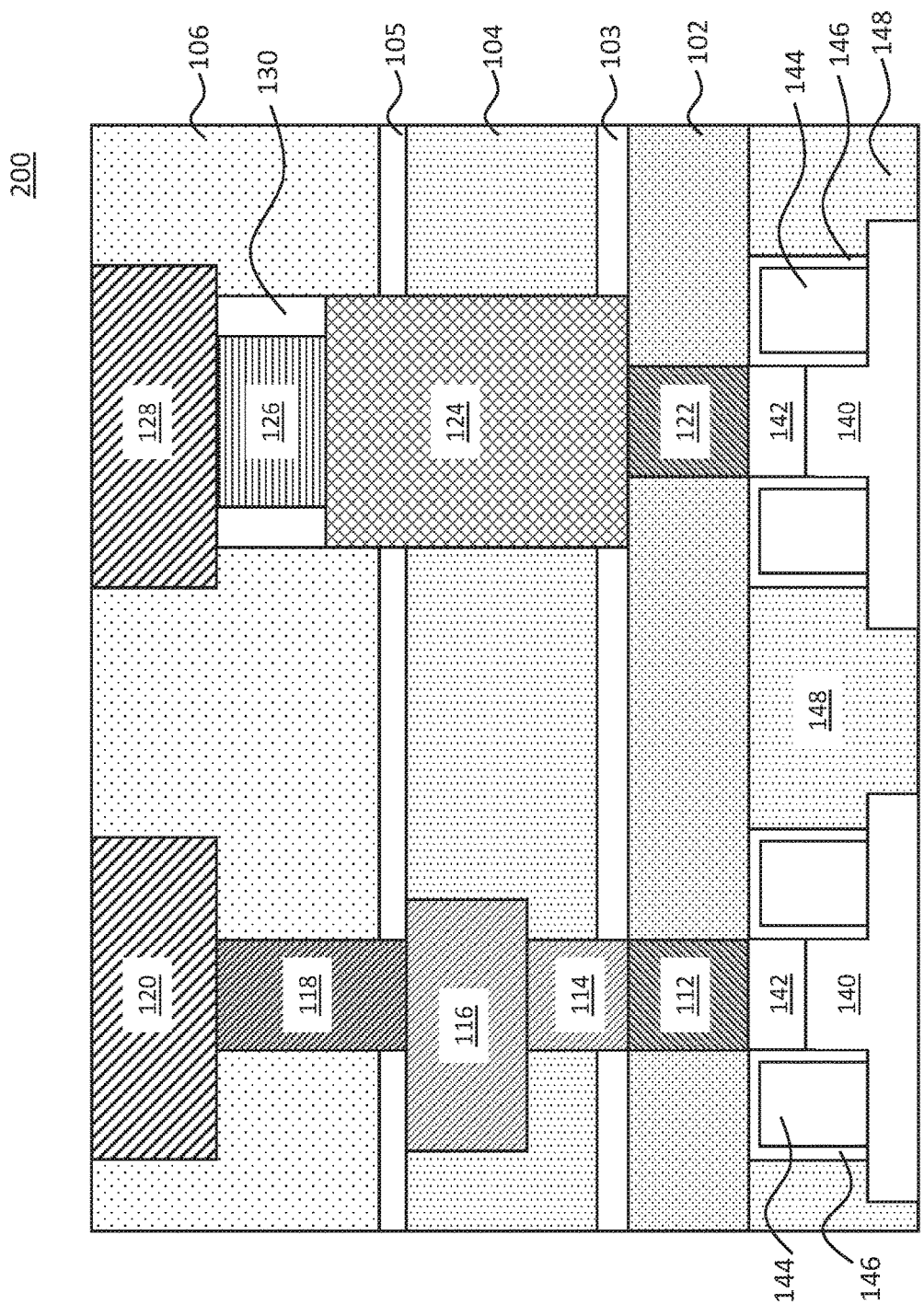
FIG. 9 is a cross-sectional view showing the MRAM device connected to a fin field effect transistor (finFET) structure in accordance with an embodiment of the present invention.

Referring now to FIG. 9, an exemplary MRAM device 200 is shown in accordance with one embodiment. In FIG. 9, the MRAM device 200 can be formed over one or more field effect transistors (finFETs) 140 having trench silicide regions 142 disposed between gate structures 144. A spacer material 146 is disposed over the gate structures 144 after gate patterning, and can include silicon nitride. The finFET can be disposed in an insulating layer 148, such as an oxide material. The landing pad 124 couples the MTJ 126 to drain contacts 122 and drain regions 142 in finFETs 140 in lower wiring layers 148. Accordingly, the MRAM device 200, as well as MRAM device 100, can be implemented in Middle of the Line (MOL) devices. In an alternate embodiment, the landing pad 124 can be formed directly on the trench silicide regions 142, and conductor 122 can be omitted. It should be noted that insulating layer 148 is a front-end of line where the finFET devices 140 are disposed, and the landing pad 124 can be placed in the contact level (middle-of the line (MOL)) as opposed to a typical metallization or interconnect level, in accordance with the present principles.

Figure 10:
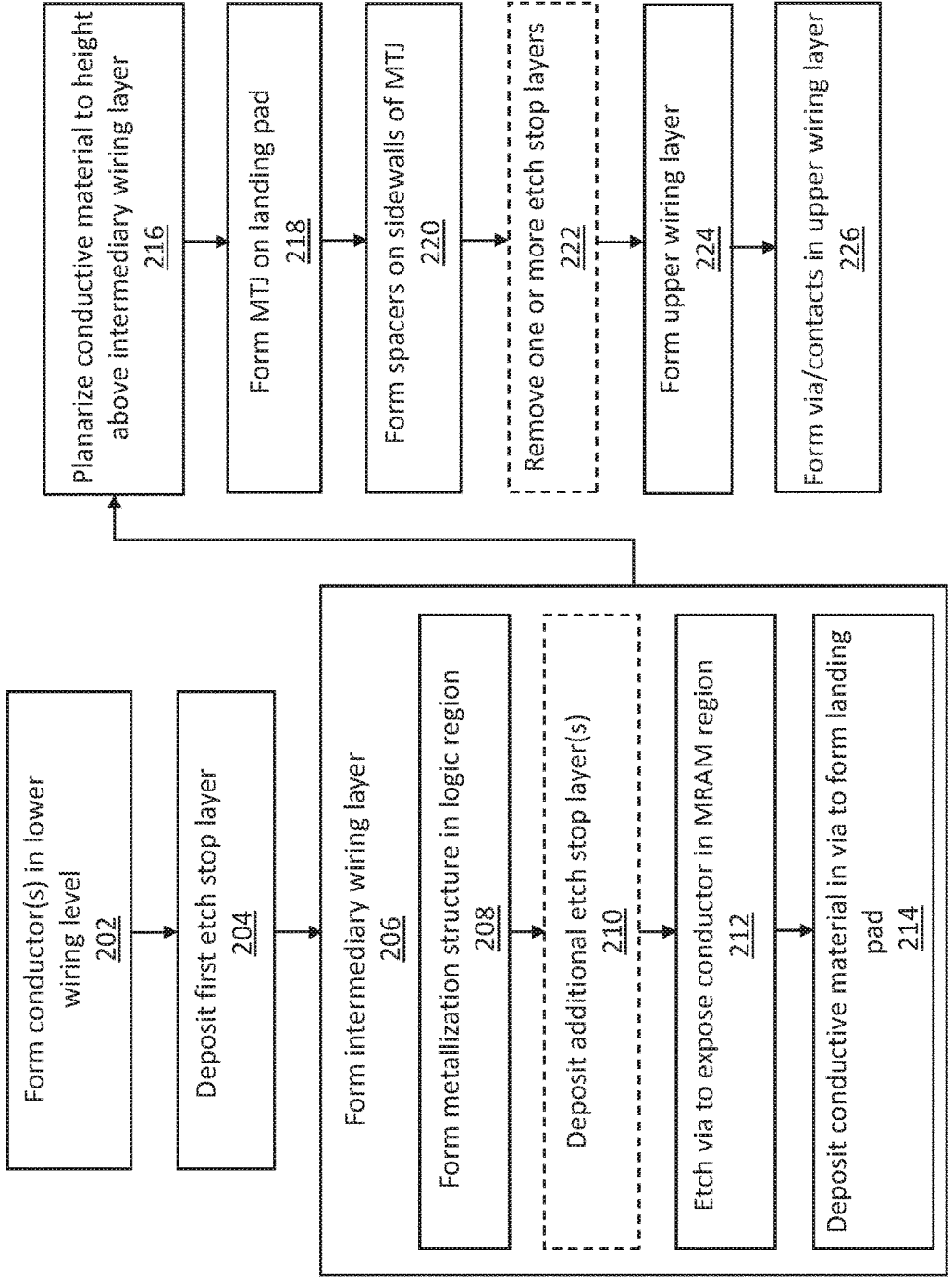
FIG. 10 is a block/flow diagram showing a method for forming the MRAM device in accordance with illustrative embodiments.

Now referring to FIG. 10, a method 200 for forming a MRAM device 100 is shown in accordance with illustrative embodiments.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 202, conductors 112, 122 are formed in a lowering wiring layer 102. For example, a first insulating material may be deposited followed by an etching process to form vias in the lower wiring layer 102. Each of the vias may be filled with conductive material and planarized such that the conductors 112, 122 are disposed within a thickness of the lower wiring layer 102. A first etch stop layer 103 can be conformally deposited over the lower wiring layer 102, as shown in block 204.

In block 206, an intermediary wiring layer 104 is formed. It should be noted that while a single layer is disclosed, the intermediary wiring layer 104 can include a plurality of layers. Forming the intermediary wiring layer 104 can include depositing a second insulating layer over the lower wiring layer 102 and/or first etch stop layer 103.

In an embodiment, a metallization structure can be formed in a logic region 108 of the MRAM device 100, as shown in block 208. The metallization structure can include, for example, a via 114 and line 116 (e.g., a dual damascene metallization feature). According to some embodiments, the metallization structure 114, 116 can be formed in multiple etching and deposition processes. For example, the second insulating layer 104 can be etched to form a via, and the via is filled with conductive material to form the via 114. Subsequently, the second insulating layer 104 can be etched again to form a trench over the via 114, and a conductive material can be deposited in the trench to form the metallization line 116. While separate etching/deposition processes are shown, it is readily contemplated that the via 114 and metallization line 116 can be formed concurrently.

In block 210, one or more etch stop layers 105, 107, 109 can be formed over the intermediary wiring layer 104. An etch process can be performed to provide a via 401 in the MRAM region 110, as shown in block 212. The via exposes the conductor 122 in the lower wiring layer 102. In block 214, a conductive material can be deposited in the via 401 to form a conductive landing pad 124, and the conductive material can be planarized to a height above the intermediary wiring layer 104, as shown in block 216.

In block 218, an MTJ 126 is formed over the landing pad 126. The MTJ 126 can be formed by depositing one or more magnetic (e.g., ferromagnetic) layers separated by an intermediary non-magnetic tunnel barrier layer and patterned to form the MTJ structure 126. Spacers 130 can be formed on sidewalls of the MTJ 126 to encapsulate the MTJ 126, protect the MTJ stack 126 and prevent diffusion, as shown in block 220.

In an embodiment, one or more of the etch stop layers (if present) can be removed by an etch process, as shown in block 222. It should be noted that the functions of block 222 are optional. In block 224, an upper wiring layer 106 can be formed by, for example, depositing an insulating material in spaces between the logic structure 108 and MRAM structure 110. A via 118 and contacts 120, 128 can be formed in the upper wiring layer 106 by etching the insulating material of the upper wiring layer 106 and depositing a conductive material, as shown in block 226.

As described above, the landing pad 124 disclosed herein extends multiple wiring levels (e.g., M0, M1, M2, etc.), directly coupling the MTJ 126 to conductors 122 in lower wiring levels. Because there are less interfaces between the MTJ 126 and the conductor 122, the MRAM device 100 provides lower vertical resistance versus conventional devices and prevents damage to prior interconnect structures disposed in lower wiring layers. In addition, the landing pad 124 patterning can be chosen independently of the interconnect patterning in the logic region 108 and be specifically tailored to optimize the MRAM cell density.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a magnetic random access memory (MRAM) device, comprising:
    forming at least one conductor disposed in a lower wiring layer;
    forming an intermediary wiring layer having metallization lines formed in an insulating material;
    forming a via in the insulating material of the intermediary wiring layer down to the lower wiring layer in an MRAM region to expose the at least one conductor;
    depositing a conductive material in the via, the conductive material traversing multiple wiring layers in addition to the intermediary wiring layer;
    planarizing the conductive material to a height above the intermediary wiring layer to form a landing pad extending from a top surface of the at least one conductor to the height;
    forming a magnetic tunnel junction (MTJ) structure in an upper wiring layer disposed over the landing pad such that the landing pad connects the MTJ structure to the at least one conductor, the MTJ structure being formed in direct contact with the landing pad; and
    forming contacts to the MTJ structure in the upper wiring layer.

2. The method of claim 1, wherein the landing pad is formed from a same material such that the landing pad is free of interfaces.

3. The method of claim 1, further comprising forming spacers on sidewalls of the MTJ structure to prevent diffusion and protect the MTJ structure from subsequent processing.

4. The method of claim 1, further comprising conformally depositing at least one etch stop layer disposed between the lower wiring layer and the intermediary wiring layer.

5. The method of claim 1, further comprising conformally depositing at least one etch stop layer disposed between the intermediary wiring layer and the upper wiring layer.

6. The method of claim 1, wherein forming the MTJ structure further comprises:
    depositing at least two magnetic layers separated by a non-magnetic tunnel barrier layer; and
    patterning the at least two magnetic layers and the non-magnetic tunnel barrier layer to form the MTJ structure.

7. The method of claim 1, further comprising depositing a dielectric material above the intermediary wiring level and around the MTJ structure to form the upper wiring level.

8. The method of claim 1, wherein the landing pad is in direct contact with the at least one conductor in the lower wiring layer.

9. A method for forming a magnetic random access memory (MRAM) device, comprising:
    forming at least one conductor disposed in a lower wiring layer;
    forming an intermediary wiring layer having metallization lines formed in an insulating material;
    forming a via in the insulating material of the intermediary wiring layer down to the lower wiring layer in an MRAM region to expose the at least one conductor;
    depositing a conductive material in the via, the conductive material traversing multiple wiring layers in addition to the intermediary wiring layer;
    planarizing the conductive material to a height above the intermediary wiring layer to form a landing pad extending from a top surface of the at least one conductor to the height, the landing pad being formed from a same material such that the landing pad is free of interfaces;
    forming a magnetic tunnel junction (MTJ) structure in an upper wiring layer disposed over the landing pad such that the landing pad connects the MTJ structure to the at least one conductor, the MTJ structure being formed in direct contact with the landing pad;
    forming spacers on sidewalls of the MTJ structure to prevent diffusion; and
    forming contacts to the MTJ structure in the upper wiring layer.

10. The method of claim 9, further comprising conformally depositing at least one etch stop layer disposed between the lower wiring layer and the intermediary wiring layer.

11. The method of claim 9, further comprising conformally depositing at least one etch stop layer disposed between the intermediary wiring layer and the upper wiring layer.

12. The method of claim 9, further comprising depositing a dielectric material above the intermediary wiring level and around the MTJ structure to form the upper wiring level.

13. The method of claim 9, wherein the landing pad is in direct contact with the at least one conductor in the lower wiring layer.

* * * * *